United States Patent
Zhang et al.

(10) Patent No.: US 10,797,087 B2
(45) Date of Patent: Oct. 6, 2020

(54) ARRAY SUBSTRATE MANUFACTURING METHOD THEREOF AND DISPLAY DEVICE

(71) Applicants: CHENGDU BOE OPTOELECTRONICS TECHNOLOGY CO., LTD., Chengdu, Sichuan (CN); BOE TECHNOLOGY GROUP CO., LTD., Beijing (CN)

(72) Inventors: Zhengdong Zhang, Beijing (CN); Gang Zhou, Beijing (CN); Hua Tian, Beijing (CN); Xiaofei Yang, Beijing (CN); Ke Dai, Beijing (CN); Lei Su, Beijing (CN); Xun Mou, Beijing (CN)

(73) Assignees: CHENGDU BOE OPTOELECTRONICS TECHNOLOGY CO., LTD., Chengdu, Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/327,697

(22) PCT Filed: Jun. 14, 2018

(86) PCT No.: PCT/CN2018/091320
§ 371 (c)(1),
(2) Date: Feb. 22, 2019

(87) PCT Pub. No.: WO2019/001285
PCT Pub. Date: Jan. 3, 2019

(65) Prior Publication Data
US 2019/0214411 A1    Jul. 11, 2019

(30) Foreign Application Priority Data
Jun. 28, 2017 (CN) .......................... 2017 1 0512261

(51) Int. Cl.
*H01L 27/12* (2006.01)
*H01L 29/786* (2006.01)
(Continued)

(52) U.S. Cl.
CPC ........ *H01L 27/1248* (2013.01); *H01L 27/124* (2013.01); *H01L 27/1214* (2013.01);
(Continued)

(58) Field of Classification Search
CPC ............. H01L 27/1248; H01L 27/1214; H01L 27/1296; H01L 27/124; H01L 27/1288;
(Continued)

(56) References Cited

U.S. PATENT DOCUMENTS 6,162,654 A * 12/2000 Kawabe ............ G02F 1/133512
438/30
10,317,759 B2    6/2019 Cao
(Continued)

FOREIGN PATENT DOCUMENTS

CN    101013221 A    8/2007
CN    105093746 A    11/2015
(Continued)

OTHER PUBLICATIONS

International Search Report and Written Opinion dated Aug. 24, 2018; PCT/CN2018/091320.
(Continued)

*Primary Examiner* — Sitaramarao S Yechuri (57) ABSTRACT

An array substrate, a method for manufacturing an array substrate and a display device are provided. The array substrate includes: a base substrate, and an insulating layer, a gate line, a source electrode, a drain electrode, and a data line on the base substrate. The insulating layer includes a light transmission portion and a light shielding portion, and orthographic projections of the gate line, the source elec-
(Continued)

trode, the drain electrode, and the data line on the base substrate are all within an orthographic projection of the light shielding portion on the base substrate.

14 Claims, 5 Drawing Sheets

(51) Int. Cl.
G02F 1/1335 (2006.01)
G02F 1/1362 (2006.01)

(52) U.S. Cl.
CPC ...... H01L 27/1288 (2013.01); H01L 27/1296 (2013.01); H01L 29/78633 (2013.01); H01L 29/78675 (2013.01); H01L 29/78678 (2013.01); *G02F 1/133514* (2013.01); *G02F 1/136209* (2013.01); *G02F 1/136286* (2013.01); *G02F 2201/40* (2013.01); *G02F 2202/022* (2013.01); *G02F 2202/04* (2013.01)

(58) Field of Classification Search
CPC ......... H01L 29/78633; H01L 29/78675; H01L 29/78678; G02F 2201/40; G02F 2202/022; G02F 2202/04; G02F 1/133514; G02F 1/136209; G02F 1/136286
See application file for complete search history.

(56) References Cited

U.S. PATENT DOCUMENTS

| | | | |
|---|---|---|---|
| 2004/0001170 A1* | 1/2004 | Chang | G02F 1/136227 349/106 |
| 2004/0109108 A1 | 6/2004 | Lee et al. | |
| 2007/0064179 A1* | 3/2007 | Park | G02F 1/136209 349/110 |
| 2010/0238388 A1* | 9/2010 | Hayashi | G02B 5/223 349/106 |
| 2011/0157534 A1 | 6/2011 | Hong | |
| 2015/0280007 A1* | 10/2015 | Sakakura | H01L 29/78654 257/347 |
| 2016/0195745 A1* | 7/2016 | Xu | G02F 1/136209 349/43 |
| 2019/0214411 A1 | 7/2019 | Zhang et al. | |

FOREIGN PATENT DOCUMENTS

| | | |
|---|---|---|
| CN | 107195640 A | 9/2017 |
| JP | 05-249455 A | 9/1993 |

OTHER PUBLICATIONS

First Chinese Office Action dated May 5, 2019; Appln. No. 201710512261.5.

* cited by examiner

ARRAY SUBSTRATE MANUFACTURING METHOD THEREOF AND DISPLAY DEVICE

The present application claims the priority of the Chinese Patent Application No. 201710512261.5 filed on Jun. 28, 2017, which is incorporated herein by reference as part of the disclosure of the present application.

TECHNICAL FIELD

Embodiments of the present disclosure relate to an array substrate, a method for manufacturing the array substrate, and a display device.

BACKGROUND

In liquid crystal displays, manufacturing a storage capacitor requires to manufacture an acrylic layer. Acrylic is a plastic polymer material, which has good permeability and is easy to be dyed. The acrylic layer can increase light transmittance and flatness, but the acrylic layer still has a problem of a small aperture ratio. A conventional black matrix light blocking layer is arranged on a color filter substrate, and a width of the black matrix light blocking layer is wide, so that an aperture ratio of a liquid crystal screen is small, which cannot meet the requirement of large aperture ratio of high pixel products.

SUMMARY

An object of the present disclosure is to provide an array substrate capable of increasing aperture ratio of a display device.

In one aspect of the present disclosure, an array substrate is provided, and the array substrate comprises a base substrate, and an insulating layer, a gate line, a source electrode, a drain electrode, and a data line on the base substrate, and the insulating layer comprises a light transmission portion and a light shielding portion, and orthographic projections of the gate line, the source electrode, the drain electrode and the data line on the base substrate are all within an orthographic projection of the light shielding portion on the base substrate.

In another aspect of the present disclosure, a display device is provided, and the display device comprises the array substrate described above.

In still another aspect of the present disclosure, a method of manufacturing an array substrate is provided, and the method comprises: providing a base substrate; and forming an insulating layer, a gate line, a source electrode, a drain electrode and a data line on the base substrate, wherein the insulating layer comprises a light transmission portion and a light shielding portion, and orthographic projections of the gate line, the source electrode, the drain electrode, and the data line on the base substrate are all within an orthographic projection of the light shielding portion on the base substrate.

BRIEF DESCRIPTION OF THE DRAWINGS

In order to clearly illustrate the technical solution of the embodiments of the present disclosure, the drawings of the embodiments will be briefly described. It is apparent that the described drawings are only related to some embodiments of the present disclosure and thus are not limitative of the present disclosure.

DETAILED DESCRIPTION

In order to make objects, technical details and advantages of embodiments of the disclosure clear, the technical solutions of the embodiments will be described in a clearly and fully understandable way in connection with the related drawings. It is apparent that the described embodiments are just a part but not all of the embodiments of the disclosure. Based on the described embodiments herein, those skilled in the art can obtain, without any inventive work, other embodiment(s) which should be within the scope of the disclosure.

Unless otherwise defined, all the technical and scientific terms used herein have the same meanings as commonly understood by one of ordinary skill in the art to which the present invention belongs. The terms "first," "second," etc., which are used in the description and claims of the present application, are not intended to indicate any sequence, amount or importance, but distinguish various components. The terms "comprises," "comprising," "includes," "including," etc., are intended to specify that the elements or the objects stated before these terms encompass the elements or the objects listed after these terms as well as equivalents thereof, but do not exclude other elements or objects. The phrases "connect", "connected", etc., are not intended to define a physical connection or mechanical connection, but may comprise an electrical connection which is direct or indirect. The terms "on," "under," "right," "left" and the like are only used to indicate relative position relationship, and in the case that the position of an object is described as being changed, the relative position relationship may be changed accordingly.

Figure 1:
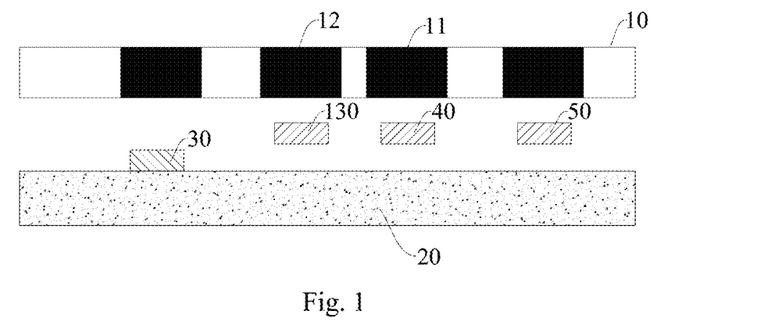
FIG. 1 is a schematic diagram of a structure of an array substrate provided by an embodiment of the present disclosure.

An embodiment of the present disclosure provides an array substrate, with reference to FIG. 1, the array substrate includes a base substrate 20 and an insulating layer 10 disposed on the base substrate 20. The insulating layer 10 includes a light transmission portion 12 and a light portion 11. Orthographic projections of a gate line 30, a source electrode 40, a drain electrode 50, and a data line 130 on the base substrate 20 are all within an orthographic projection of the light shielding portion 11 on the base substrate 20. Therefore, the light shielding portion of the insulating layer can replace a conventional black matrix, and the black matrix is not required to be formed on the color filter substrate which is cell assembled with the array substrate, in this way, a structure of the product is simplified, a thickness of the product is reduced. Because a size of the light shielding portion may be smaller than a size of the conventional black matrix, the aperture ratio is increased. The insulating layer can also play roles of increasing brightness and planarization, and the subsequent processes can be directly operated thereon, which renders simple and convenient operation.

Figure 2:
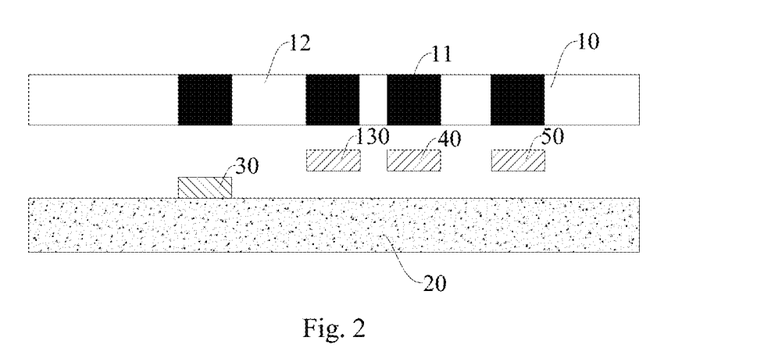
FIG. 2 is a schematic diagram of a structure of an array substrate provided by another embodiment of the present disclosure.

According to at least one embodiment of the present disclosure, in order to further reduce an area of the light shielding portion in the insulating layer and increase the aperture ratio, with reference to FIG. 2, the orthographic projection of the light shielding portion 11 on the base substrate 20 completely overlaps with the orthographic projections of the gate line 30, the source electrode 40, the drain electrode 50, and the data line 130 on the base substrate 20. That is, an area of the orthographic projection of the light shielding portion 11 on the base substrate 20 is the same as a total area of the orthographic projections of the gate line 30, the source electrode 40, the drain electrode 50, and the data line 130 on the base substrate 20. In this way, not only the gate line, the source electrode, the drain electrode and the data line are completely blocked by the light shielding portion, but also the size of the light shielding portion can be further reduced, and therefore, the aperture ratio is effectively increased.

According to at least one embodiment of the present disclosure, a material for forming the insulating layer is not particularly limited as long as it can meet the usage requirements of the array substrate. For example, the insulating layer is transparent, and the light shielding portion is formed in the insulating layer by using a physical process or a chemical process. In at least one embodiment of the present disclosure, the insulating layer is made of acrylic. Therefore, the insulation effect of the insulating layer is good, the light transmittance of the insulating layer is high, the insulating layer is easy to be dyed, and plays the role of flattening. In addition, since the existing array substrate has an acrylic layer disposed thereon, the light shielding portion can be directly firmed in the existing acrylic layer, which simplifies the manufacturing process of the product. For example, in order to form a light shielding portion in the insulating layer, a portion of the insulating layer is doped or coated with light shielding particles, such as black particles. As a result, light can be effectively blocked, the operation of doping black particles is simple and is easy to be controlled, and the thickness of the product is not increased.

Figure 8A:
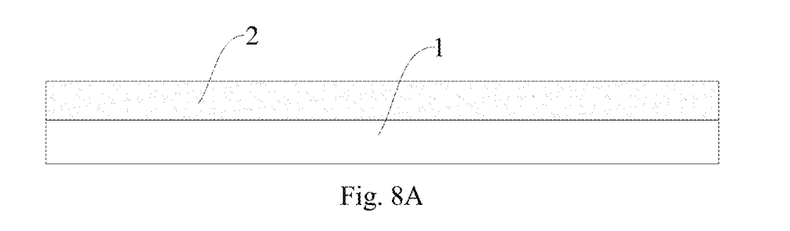
FIG. 8A to 8E are flowcharts of a method for manufacturing an insulating layer provided by an embodiment of the present disclosure.
Figure 8B:
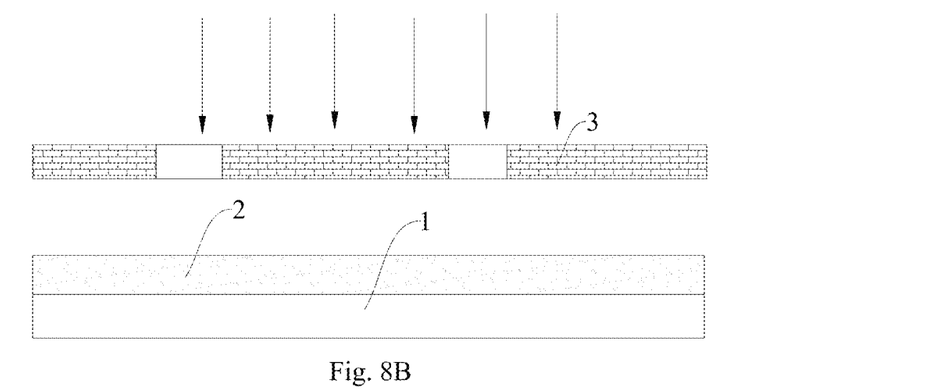
Figure 8C:
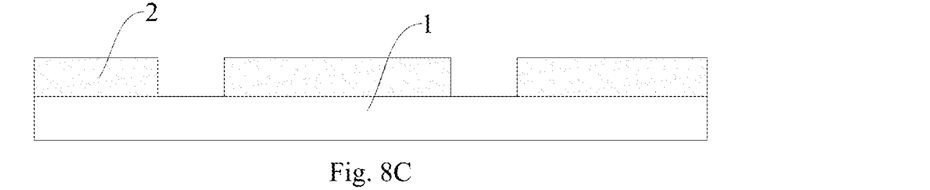
Figure 8D:
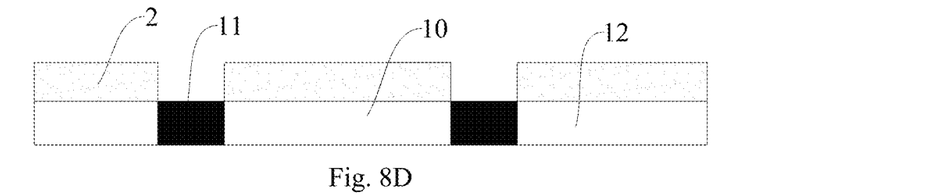
Figure 8E:
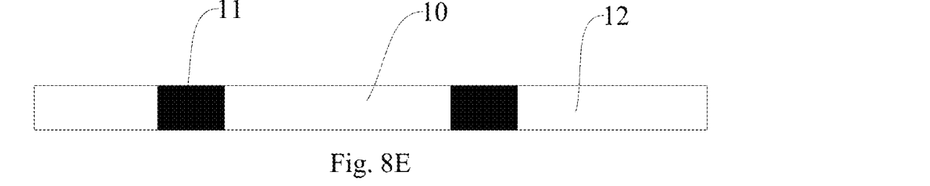
Figure 9:
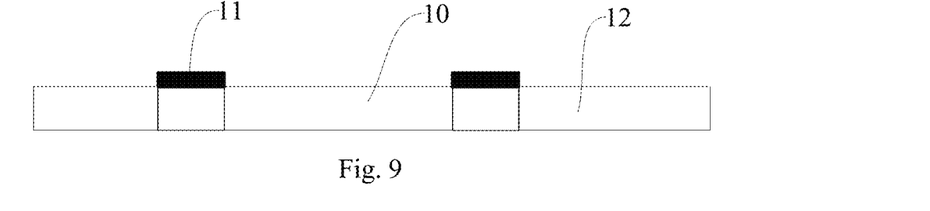
FIG. 9 is a schematic diagram of a structure of an insulating layer provided by an embodiment of the present disclosure.

According to at least one embodiment of the present disclosure, the light transmission portion 12 is made of an insulating material, and the light shielding portion 11 is made of the insulating material doped with black particles (as illustrated in FIG. 8E). Alternatively, the light transmission portion 12 is made of the insulating material, and the light shielding portion 11 is made of the insulating material coated with black particles (as illustrated in FIG. 9). That is to say, by doping a portion of the insulating material with black particles or coating black particles on the surface of the portion of the insulating material, the portion of the insulating material has a light shielding property, thus a light shielding portion is formed. For example, the insulating material is acrylic.

According to at least one embodiment of the present disclosure, there are no special restrictions on the specific composition of the black particles, as long as it can be effectively doped into the corresponding portion of the insulating layer, and has a good light shielding efficiency. According to at least one embodiment of the present disclosure, the black particles are ferroferric oxide particles. The resource of the black particles is wide, and the cost of the black particles is low. The black particles have a good light shielding efficiency and are easy to be doped in the insulating layer.

According to at least one embodiment of the present disclosure, the specific position of the insulating layer in the array substrate is not particularly limited, as long as it does not affect the normal operation of the array substrate, and it can effectively play the role of shielding light. In at least one embodiment of the present disclosure, the insulating layer is disposed between the common electrode and the source electrode, the drain electrode, the data line. That is, the source electrode, the drain electrode, and the data line are arranged on a side of the insulating layer close to the gate electrode, and the common electrode is arranged on a side of the insulating layer away from the gate electrode. Thus, the insulating layer plays the roles of insulating, flattening, increasing light transmittance and storage capacitance, and shielding light simultaneously. An area of the light shielding portion may be smaller than an area of the conventional black matrix, thus the aperture ratio is effectively increased.

Those skilled in the art can understand that, in addition to the above insulating layer, the array substrate of the present disclosure has the structures similar to the conventional array substrate in the art, including but not limited to an ADS mode array substrate, an LTPS (low temperature polysilicon) mode array substrate, etc. The specific structure of the array substrate of the present disclosure is described below by taking the ADS mode array substrate and the LTPS (low temperature polysilicon) mode array substrate for example.

Figure 3:
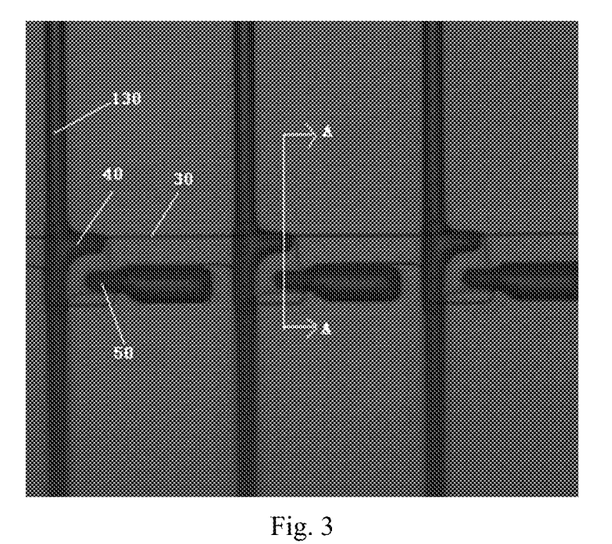
FIG. 3 is a planar view of an array substrate provided by an embodiment of the present disclosure.
Figure 4:
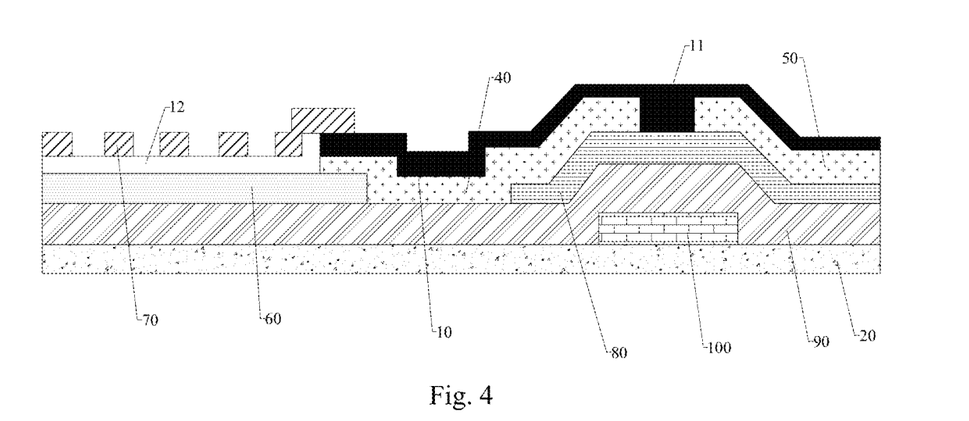
FIG. 4 is a schematic diagram of a cross section structure taken along line A-A of FIG. 3.

In at least one embodiment of the present disclosure, with reference to FIG. 3 (a photograph of an actual product after the source electrode and the drain electrode are formed) and FIG. 4, the array substrate is an ADS mode array substrate, the array substrate includes: a base substrate 20. A gate electrode 100 and a gate line 30 are disposed on a side of the base substrate 20 and located in a same layer. A gate insulating layer 90 is disposed on a side of the gate electrode 100 and the gate line 30 away from the base substrate 20, and the gate insulating layer 90 covers the gate electrode 100 and the gate line 30. An active layer 80 is disposed on a side of the gate insulating layer 90 away from the base substrate 20 and corresponds to the gate electrode 100. The pixel electrode 60 is disposed on a side of the gate insulating layer 90 away from the base substrate 200. The pixel electrode 60 and the active layer 80 are disposed on the same gate insulating layer 90. The source electrode 40, the drain electrode 50, and the data line 130 are disposed in a same layer and are disposed on a side of the active layer 80 away from the base substrate 20. An insulating layer 10 is disposed on a side of the active layer 80 away from the base substrate 20 and covers the pixel electrode 60, the source electrode 40, the drain electrode 50, the active layer 80, and the data line 130. The common electrode 70 is disposed on a side of the insulating layer 10 away from the base substrate 20. It should be noted that, the gate electrode 100 and the gate line 30 are connected to each other and constitute a same conductive pattern. A portion of the conductive pattern in a switching device (the portion corresponding to the active layer) forms the gate electrode 100, and the other portion forms the gate line 30. The source electrode 40 and the data line 130 are connected to each other and constitute a same conductive pattern. A portion of the conductive pattern close to the active layer and connected to the active layer forms the source electrode 40, and the other portion of the conductive pattern forms the data line 130.

As illustrated in FIG. 4, the insulating layer 10 comprises a light shielding portion 11 and a light transmission portion 12, and orthographic projections of the gate line 30, the source electrode 40, the drain electrode 50 and the data line 130 on the base substrate 20 are all within an orthographic projection of the light shielding portion 11 on the base substrate 20.

Figure 5:
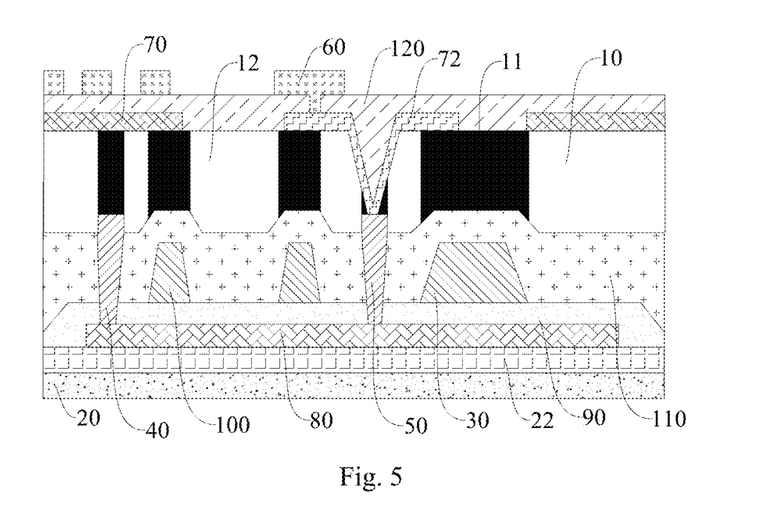
FIG. 5 is a schematic diagram of a structure of an array substrate provided by still another embodiment of the present disclosure.

In at least another embodiment of the present disclosure, the array substrate of the embodiment of the present disclosure is an LTPS mode array substrate, with reference to FIG. 5, the array substrate includes: a base substrate 20; a buffer layer 22 disposed on a side of the base substrate 20; an active layer 80 disposed on a side of the buffer layer 22 away from the base substrate 20; a gate insulating layer 90 disposed on a side of the buffer layer 22 away from the base substrate 20 and covering the active layer 80; a gate electrode 100 and a gate line 30 disposed on a side of the gate insulating layer 90 away from the base substrate 20 and disposed in a same layer; an interlayer insulating layer 110 disposed on a side of the gate insulating layer 90 away from the base substrate 20 and covering the gate electrode 100 and the gate line 30; a source electrode 40 and a drain electrode 50 disposed on a side of the interlayer insulating layer 110 away from the base substrate 20, each of the source electrode 40 and the drain electrode 50 penetrates the interlayer insulating layer 100 and is electrically connected to the active layer 80; an insulating layer 10 disposed on a side of the interlayer insulating, layer 110 away from the base substrate 20 and covering the source electrode 40 and a drain electrode 50; a common electrode 70 disposed on a side of the insulating layer 10 away from the base substrate 20; a connection electrode 72 disposed on a side of the insulating layer 10 away from the base substrate 20, the connection electrode 72 penetrates the insulating layer 10 and is electrically connected to the drain electrode 50; and a second insulating layer 120 disposed on a side of the insulating layer 10 away from the base substrate 20 and covering the common electrode 70 and the connection electrode 72; a pixel electrode 60 disposed on a side of the second insulating layer 120 away from the base substrate 20, the pixel electrode 60 penetrates the second insulating layer 120 and is electrically connected to the connection electrode 72. It should be noted that, the source electrode 40 is connected to the data line 130, and the light shielding portion in the insulating layer also covers the data line, and the data line 130 is not shown in FIG. 5. In addition, for the convenience of manufacturing, a portion of the insulating layer corresponding to the active layer is set as a light shielding portion in the array substrate as shown in FIG. 5. Therefore, the manufacturing process is simple, and the entire switching device is completely blocked, and the display effect is better.

As illustrated in FIG. 5, the insulating layer 10 comprises a light shielding portion 11 and a light transmission portion 12, and orthographic projections of the gate line 30, the source electrode 40, the drain electrode 50 and the data line 130 on the base substrate 20 are all within an orthographic projection of the light shielding portion 11 on the base substrate 20.

In at least one embodiment of the present disclosure, the insulating layer 10 is formed by appropriately processing the acrylic layer in the conventional ADS display mode array substrate or the LTPS display mode array substrate, which not only increases the transmittance of light and plays the role of flattening, but also replaces the conventional black matrix. The shielding area may be smaller than the area of the conventional black matrix, and the aperture ratio is greatly increased. In addition, no new structure is added, the thickness of the product is not increased, and the black matrix is not required to be disposed on the color filter substrate which is cell assembled with the array substrate, which simplifies the product structure. In addition, those skilled in the art can understand that the pixel electrode and the common electrode in the ADS display mode array substrate or the LTPS mode array substrate are interchangeable, and FIG. 4 and FIG. 5 only show one case, which is not limitative of the present disclosure.

At least one embodiment of the present disclosure further provides a display device, and the display device comprises any one of the array substrates described above. In this way, the structure of the display device is simple, the thickness of the display device is small, the aperture ratio is large, the display quality is high, and the display device has all the features and advantages described above, which is omitted herein.

According to at least one embodiment of the present disclosure, the specific type of the display device is not particularly limited, and is any devices or equipments having a display function in the art For example, the display device includes but not limited to, a mobile phone, a tablet computer, a computer display, a game machine, a television, a display screen, a wearable device, and other living appliances or household appliances with display functions.

Figure 10:
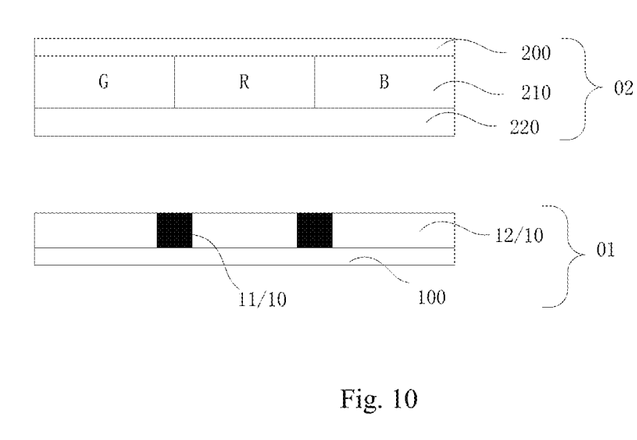
FIG. 10 is a schematic diagram of a structure of a display panel provided by an embodiment of the present disclosure.

As illustrated in FIG. 10, the display device in the embodiment of the present disclosure includes an array substrate 01 and a color filter substrate 02 which are disposed opposite to each other. For example, the array substrate 01 includes a glass substrate 100 and an insulating layer 10. The insulating layer 10 comprises the light shielding portion 11 and the light transmission portion 12, the specific structure and material of the insulating layer 10 in the array substrate 01 is described in the above mentioned embodiments, which is omitted herein. The color filter substrate 02 includes a glass substrate 200, a color filter layer 210, and a planarization layer 220. Because the light shielding portion 11 can replace the black matrix, the color filter substrate 02 is not provided with a black matrix, and in a case that the color filter substrate 02 is cell assembled with the array substrate 01, the light shielding portion 11 can play the role of the black matrix.

For example, the color filter layer 210 comprises a plurality of color filter units R, G, B, and the light shielding portion 11 corresponds to boundaries of any two adjacent color filter units, that is, an orthographic projection of the light shielding portion 11 on the glass substrate 200 is at the boundaries of any two adjacent color filter units.

Those skilled in the art can understand that, in addition to the array substrate described above, the display device in the embodiment of the present disclosure further include necessary structures and components of the conventional display device. Taking a mobile phone as an example, in addition to the array substrate of the embodiment of the present disclosure, the display device further includes a touch screen, a shell, a Central Processing Unit (CPU), a camera module, a fingerprint recognition module, a sound processing system, and other structures or components of conventional mobile phones, more details are omitted herein.

At least one embodiment of the present disclosure further provides a method of manufacturing an array substrate. According to at least one embodiment of the present disclosure, with reference to FIG. 6, the method comprises: providing a base substrate 20; and forming an insulating layer 10, a gate line 30, a source electrode 40, a drain electrode 50 and a data line 130 on the base substrate 20, and the insulating layer 10 comprises a light transmission portion 12 and a light shielding portion 11, and orthographic projections of the gate line 30, the source electrode 40, the drain electrode 50, and the data line 130 on the base substrate are all within an orthographic projection of the light shielding portion 11 on the base substrate 20. Therefore, the technology is mature, the operation is simple, and it is easy to industrialize production. Because the insulating layer has a light shielding portion, the insulating layer can replace the conventional black matrix. It is not necessary to arrange a black matrix on the color filter substrate cell assembled with the obtained array substrate, which simplifies the structure of the product. For example, the area of the light shielding portion is smaller than the area of the conventional black matrix, and the aperture ratio is greatly increased.

Figure 6:
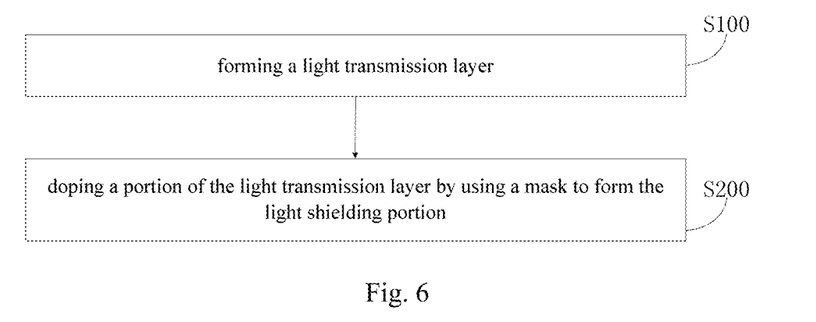
FIG. 6 is a flowchart of a method for manufacturing an insulating layer provided by an embodiment of the present disclosure.

According to at least one embodiment of the present disclosure, with reference to FIG. 6, forming the insulating layer comprises:

S100: forming a light transmission layer.

According to at least one embodiment of the present disclosure, a material for forming the insulating layer is not particularly limited as long as it can meet the usage requirements of the array substrate. For example, the insulating layer is transparent, and the light shielding portion is formed in the insulating layer by using a physical process or a chemical process. In at least one embodiment of the present disclosure, the insulating layer is made of acrylic. Therefore, the insulation effect of the insulating layer is good, the light transmittance of the insulating layer is high, the insulating layer is easy to be dyed, and plays the role of flattening. In addition, since the existing array substrate has an acrylic layer disposed thereon, the light shielding portion can be directly formed in the existing acrylic layer, which simplifies the manufacturing process of the product. For example, in order to form a light shielding portion in the insulating layer, a portion of the insulating layer is doped or coated with light shielding particles, such as black particles. Thereby, light can be effectively blocked, the operation of doping black particles is simple and is easy to be controlled, and the thickness of the product is not increased.

According to at least one embodiment of the present disclosure, the method for manufacturing the light transmission layer is not particularly limited, those skilled in the art can flexibly choose the method according to actual needs. According to some embodiments of the present disclosure, the method for manufacturing the light transmission layer includes, but is not limited to, depositing, coating, printing, etc.

S200: doping a portion of the light transmission layer by using a mask to form the light shielding portion, such that an insulating layer is obtained.

Figure 7:
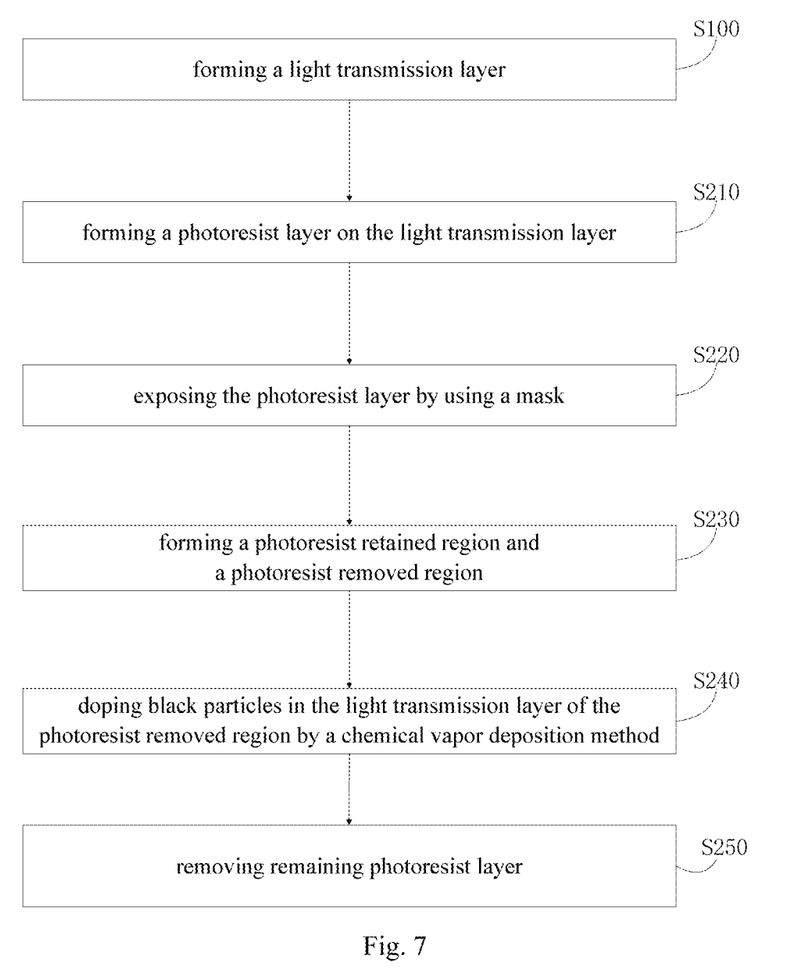
FIG. 7 is a flowchart of a method for manufacturing an insulating layer provided by another embodiment of the present disclosure.

According to at least one embodiment of the present disclosure, the specific operation mode of the step is not particularly limited as long as the substance having a light shielding effect can be effectively doped to the corresponding portion of the light transmission layer to form the light shielding portion. In some embodiments of the present disclosure, with reference to FIG. 7, doping a portion of the light transmission layer by using the mask to form the light shielding portion comprises:

S210: (brining a photoresist layer 2 on the light transmission layer 1, with reference to FIG. 8.

According to at least one embodiment of the present disclosure, the method for forming the photoresist layer is not particularly limited, those skilled in the art can flexibly choose the method according to actual requirements. According to some embodiments of the present disclosure, the method for forming the photoresist layer includes, but is not limited to coating and printing, etc. According to at least one embodiment of the present disclosure, the specific composition of a material of the photoresist layer is also not particularly limited, for example, is a positive photoresist or a negative photoresist.

S220: exposing the photoresist layer 2 by using the mask 3, with reference to FIG. 8B.

According to at least one embodiment of the present disclosure, the step can be carried out by a conventional operation in the field, and the mask has a pattern same as a light shielding pattern or complementary with the light shielding pattern.

S230: developing the photoresist layer which has been exposed, with reference to FIG. 8C, forming a photoresist retained region 201 and a photoresist removed region 202.

According to at least one embodiment of the present disclosure, the step can be carried out by a conventional operation in the field.

S240: doping black particles in the light transmission layer by a chemical vapor deposition method, with reference to FIG. 8D.

According to at least one embodiment of the present disclosure, there is no special restriction on the specific composition of the black particles, as long as it can be effectively doped to the corresponding portion of the insulating layer, and has a good light shielding effect. According to at least one embodiment of the present disclosure, the black particles are ferroferric oxide particles. Thus, the resource of the black particles is wide, and the cost of the black particles is low. The black particles have good light shielding effect and are easy to be doped in the insulating layer.

In some embodiments of the present disclosure, doping small black $Fe_3O_4$ particles in the light transmission layer made of acrylic by the chemical vapor deposition method (CVD). $Fe_3O_4$ and polymethyl methacrylate (acrylic) are copolymerization cross-linked by secondary valence or solidification cross-linked to form a black acrylic material with a light shielding effect, thus, similar to the black matrix (BM), the light shielding portion 11 is formed to block the light.

S250: removing the remaining photoresist layer, with reference to FIG. 8E.

According to at least one embodiment of the present disclosure, in the step, the remaining photoresist is stripped by a strip process to obtain the required insulating layer which is designed as a BM shielding layer. Of course, those skilled in the art can understand that in addition to the above steps of forming the insulating layer, the steps of forming other structures of the conventional array substrate are also included, such as the steps of forming the gate electrode, the gate line, the gate insulating layer, the active layer, the source electrode, the drain electrode, the common electrode, the interlayer insulating layer, the pixel electrode, etc. For example, the step of forming the insulating layer is performed after the step of forming the source electrode and the drain electrode, and before the step of forming the common electrode.

According to another embodiment of the present disclosure, forming the insulating layer comprises: forming a light transmission layer; and coating a portion of the light transmission layer by using a mask to form the light shielding portion, such that the insulating layer is obtained.

For example, with reference to FIG. 9, the mask 3 in FIG. 8B is used while a light shielding material is coated on the surface of the portion of the light transmission layer 1 corresponding to a light transmission region, thereby the light shielding portion 11 is formed. This method does not need to manufacture the photoresist layer 2 on the light transmission layer 1, therefore the method is simpler and easy to operate.

The specific method of manufacturing the array substrate of the present application is described below by taking the array substrate as illustrated in FIG. 3 to FIG. 5 for example.

In some embodiments of the present disclosure, the method for manufacturing the ADS display mode array substrate as illustrated in FIG. 3 includes:

S300: forming a gate electrode 100 and a gate line 30 on the base substrate 20 by one patterning process;

S301: depositing a gate insulating layer 90 covering the gate electrode 100 and the gate line 30;

S302: forming an active layer 80 on a side of the gate insulating layer 90 away from the base substrate 20 by one patterning process;

S303: forming a source electrode 40, a drain electrode 50, and a data line 130 by one patterning process;

S304: forming a pixel electrode 60 by one patterning process;

S305: depositing an acrylic layer 10 on a side of the gate insulating layer 90 away from the base substrate 20, and then performing the doping process or coating process described in the above embodiments.

For example, the acrylic layer is capable of transmitting light, after the light transmission acrylic layer is deposited, a photoresist (PR adhesive) is coated on the light transmission acrylic layer. A portion of the PR adhesive corresponding to and disposed above the gate line 30, the source electrode 40, the drain electrode 50, and the data line 130 are exposed by the mask, and then developed to form a photoresist retained region and a photoresist removed region. Then, small black $Fe_3O_4$ particles are doped in a portion of the light transmission acrylic layer within the photoresist removed region by using the chemical vapor deposition method (CVD). $Fe_3O_4$ and polymethyl methacrylate (acrylic) are copolymerization cross-linked by secondary valence or solidification cross-linked to form a black acrylic material with a light shielding effect, in this way, the light shielding portion 11 similar to the black matrix (BM) is formed to blocking the light. After the doping process is completed, the remaining photoresist is stripped by a strip process to obtain the required acrylic layer 10 which is used as both the BM shielding layer and the insulating layer at the same time.

S306: forming a common electrode 70 on a side of the acrylic layer 10 having the light shielding portion away from the base substrate 20 by one patterning process.

In other embodiments of the present disclosure, the method for manufacturing the LTPS mode array substrate as illustrated in FIG. 5 comprises:

S400: depositing a buffer layer 22 on the base substrate 20. For example, the buffer layer 22 is formed by the chemical vapor deposition method or the physical vapor deposition method. The material of the buffer layer 22 is at least one of $SiN_x$ and $SiO_2$, or the buffer layer 22 is a multilayer structure made of different materials, for example, a two-layer structure made of a $SiN_x$ layer and a $SiO_2$ layer.

S401: forming an active layer 80 by one patterning process. For example, an amorphous silicon layer is formed on an entire surface of the buffer layer 22, followed by dehydrogenation, HF cleaning, laser annealing, etching, stripping photoresist, and $V_{th}$ doping to form the active layer 80. Dehydrogenation removes hydrogen in amorphous silicon, so that hydrogen explosion is not occurred during laser annealing, $V_{th}$ doping can adjust electrical property of polysilicon to meet the product design specifications.

S402: depositing a gate insulating layer 90 on the buffer layer 22 to cover the active layer 80, and performing $C_{st}$ doping on the active layer 80 by using a mask. In the step, the $C_{st}$ doping makes the polysilicon having conductive property and a storage capacitor is formed between the polysilicon and the gate electrode.

S403: forming a gate electrode 100 and a gate line 30 on a side of the gate insulating layer 90 away from the base substrate 20 by a patterning process. For example, a Mo plating layer is formed on a side of the gate insulating layer 90 away from the base substrate 20, and then the Mo plating layer is etched, doped and so on to form the gate electrode 100 and the gate line 30.

S404: depositing an interlayer insulating layer 110 on a side of the gate insulating layer 90 away from the base substrate 20. For example, in the step, plating an interlayer insulating film, activation, hydrogenation and via etching are performed in turn to form the interlayer insulating layer 110. The material of the interlayer insulating layer 110 is at least one of $SiN_x$ and $SiO_2$, or the interlayer insulating layer 110 is a multilayer structure made of different materials, for example, a two-layer structure made of a $SiN_x$ layer and a $SiO_2$ layer.

S405: forming a source electrode 40, a drain electrode 50, and a data line 130 (not illustrated in FIG. 5) on a side of the interlayer insulating layer 110 away from the base substrate 20. For example, a Ti/Al/Ti plating film is formed on a side of the interlayer insulating layer 110 away from the base substrate 20, and then the source electrode 40, the drain electrode 50, and the data line 130 being electrically connected to the active layer 80 and penetrating through the interlayer insulating layer 110 are formed by etching the Ti/Al/Ti plating film.

S406: forming an acrylic layer on a side of the interlayer insulating layer 110 away from the base substrate 20. For example, a light transmission acrylic layer is formed by a coating method or a depositing method, and then a photoresist (PR adhesive) is coated on the light transmission acrylic layer. A portion of the PR adhesive corresponding to and disposed above the gate line 30, the source electrode 40, the drain electrode 50, and the data line 130 are exposed by the mask, and then developed to form a photoresist retained region and a photoresist removed region. Then, small black $Fe_3O_4$ particles are doped in a portion of the light transmission acrylic layer within the photoresist removed region by using the chemical vapor deposition method (CVD). $Fe_3O_4$ and polymethyl methacrylate (acrylic) are copolymerization cross-linked by secondary valence or solidification cross-linked to form a black acrylic material with a light shielding effect, in this way, the light shielding portion 11 similar to the black matrix (BM) is formed to blocking the light. After the doping process is completed, the remaining photoresist is stripped by a strip process to obtain the required acrylic layer 10 which is used as both the BM shielding layer and the insulating layer at the same time.

S407: forming a common electrode 70 and a connection electrode 72 on a side of the acrylic layer 10 away from the base substrate 20 by a patterning process. For example, an a-ITO plating film is formed on a side of the acrylic layer 10 away from the base substrate 20, and then the a-ITO plating film is etched, annealed, and so on to form the common electrode 70 and the connection electrode 72. The a-ITO is changed into a P-ITO (polycrystalline ITO) by annealing, and the common electrode 70 and the connection electrode 72 are more stable.

S408: forming a second insulating layer 120 on a side of the acrylic layer 10 away from the base substrate 20. For example, an insulating layer plating film is formed and then is etched to form the second insulating layer 120.

S409: forming a pixel electrode 60 on a side of the second insulating layer 120 away from the base substrate 20. For example, an a-ITO plating film is formed firstly, and then is etched and annealed to form the pixel electrode 60.

In the present disclosure, please note that:

(1) the drawings of the embodiments of the present disclosure are only related to the structures mentioned in the embodiments of the present disclosure, and other structures can be obtained by general designs;

(2) for the sake of clarity, sizes of layers or regions in the drawings for describing the embodiments of the present disclosure are not drawn according to an actual scale but are exaggerated or diminished; and (3) the embodiments of the present disclosure and the features therein can be combined with each other in the absence of conflict.

What is described above is related to only the illustrative embodiments of the disclosure and not limitative to the scope of the disclosure. The scopes of the disclosure are defined by the accompanying claims.

What is claimed is:

1. An array substrate, comprising:
   a base substrate;
   an insulating layer, a gate line, a source electrode, a drain electrode, and a data line on the base substrate,
   wherein the insulating layer comprises a light transmission portion and a light shielding portion, and orthographic projections of the gate line, the source electrode, the drain electrode, and the data line on the base substrate are all within an orthographic projection of the light shielding portion on the base substrate,
   the array substrate further comprising:
   a common electrode, on the base substrate; and
   a pixel electrode, on the base substrate same as the common electrode and between the common electrode and the gate insulation layer;
   wherein part of the light-transmitting portion of the insulating layer is between the common electrode and the pixel electrode, and the part of the light-transmitting portion of the insulating layer is in direct contact with both the common electrode and the pixel electrode.

2. The array substrate according to claim 1, wherein the orthographic projection of the light shielding portion on the base substrate completely overlaps with the orthographic projections of the gate line, the source electrode, the drain electrode and the data line on the base substrate.

3. The array substrate according to claim 1, wherein the insulating layer is made of acrylic.

4. The array substrate according to claim 1, wherein the light shielding portion is doped or coated with black particles.

5. The array substrate according to claim 4, wherein the black particles comprise ferroferric oxide particles.

6. The array substrate according to claim 1, wherein the light transmission portion is made of an insulating material, and the light shielding portion is made of the insulating material doped with black particles.

7. The array substrate according to claim 1, wherein the light transmission portion is made of an insulating material, and the light shielding portion is made of the insulating material coated with black particles.

8. The array substrate according to claim 1, wherein the source electrode, the drain electrode, and the data line are disposed on a side of the insulating layer close to the gate line, and the common electrode is disposed on a side of the insulating layer away from the gate line.

9. A display device, comprising the array substrate according to claim 1.

10. The display device according to claim 9, further comprising: an opposed substrate disposed opposite to the array substrate, wherein the opposed substrate is not provided with a light shielding material.

11. The display device according to claim 10, wherein the opposed substrate is a color filter substrate, and the color filter substrate comprises a color filter layer, and the color filter substrate is not provided with a black matrix.

12. The display device according to claim 11, wherein the color filter layer comprises a plurality of color filter units, wherein the light shielding portion of the array substrate corresponds to boundaries between any two adjacent color filter units.

13. The array substrate according to claim 1, wherein the pixel electrode is in direct contact with both the common electrode and the gate insulation layer.

14. A method of manufacturing an array substrate, comprising:
   providing a base substrate; and
   forming an insulating layer, a gate line, a source electrode, a drain electrode, and a data line on the base substrate,
   wherein the insulating layer comprises a light transmission portion and a light shielding portion, and orthographic projections of the gate line, the source electrode, the drain electrode, and the data line on the base substrate are all within an orthographic projection of the light shielding portion on the base substrate,
   wherein forming the insulating layer comprises:
   forming a light transmission layer; and
   doping a portion of the light transmission layer by using a mask to form the light shielding portion, such that the insulating layer is obtained,
   wherein doping the portion of the light transmission layer by using the mask comprises:
   forming a photoresist layer on the light transmission layer;
   exposing and developing the photoresist layer by using the mask to form a photoresist retained region and a photoresist removed region;
   doping black particles in the light transmission layer of the photoresist removed region by a chemical vapor deposition method; and
   removing remaining photoresist layer.

* * * * *